United States Patent
Ahmad

(10) Patent No.: US 7,830,223 B2
(45) Date of Patent: Nov. 9, 2010

(54) GROUND STRADDLING IN PTH PINFIELD FOR IMPROVED IMPEDANCE

(75) Inventor: Bilal Ahmad, Ottawa (CA)

(73) Assignee: Cisco Technology, Inc., Santa Clara, CA (US)

( * ) Notice: Subject to any disclaimer, the term of this patent is extended or adjusted under 35 U.S.C. 154(b) by 258 days.

(21) Appl. No.: 12/107,970

(22) Filed: Apr. 23, 2008

(65) Prior Publication Data

US 2009/0188711 A1    Jul. 30, 2009

Related U.S. Application Data

(60) Provisional application No. 61/024,785, filed on Jan. 30, 2008.

(51) Int. Cl.
*H03H 7/38* (2006.01)

(52) U.S. Cl. .......................... 333/33; 174/262

(58) Field of Classification Search .............. 333/33; 174/260–262, 265, 267; 439/886
See application file for complete search history.

(56) References Cited

U.S. PATENT DOCUMENTS 6,941,649 B2 *   9/2005   Goergen .................. 29/846

* cited by examiner

*Primary Examiner*—Stephen E Jones
(74) *Attorney, Agent, or Firm*—Schwegman, Lundberg & Woessner, P.A.

(57) ABSTRACT

High-speed communication links are improved by having differential pairs of traces in a connector pinfield on layers of a multilayer printed circuit board (PCB) to straddle respective rows of reference (ground) pins rather than the respective rows of signal vias. Thus, a desirable increase in the size of each an anti-pad to surrounding each signal via pad can be incorporated without forcing tracing of adjacent differential pairs closer to one another, and thus increased cross talk is avoided. Thereby, 50 ohm or close to 50 ohm impedance for each signal via is achieved. Spacing and routing between traces of each differential pair are advantageously adjusted for skew compensation and impedance optimization utilizing three dimensional computational electromagnetic tools.

18 Claims, 10 Drawing Sheets

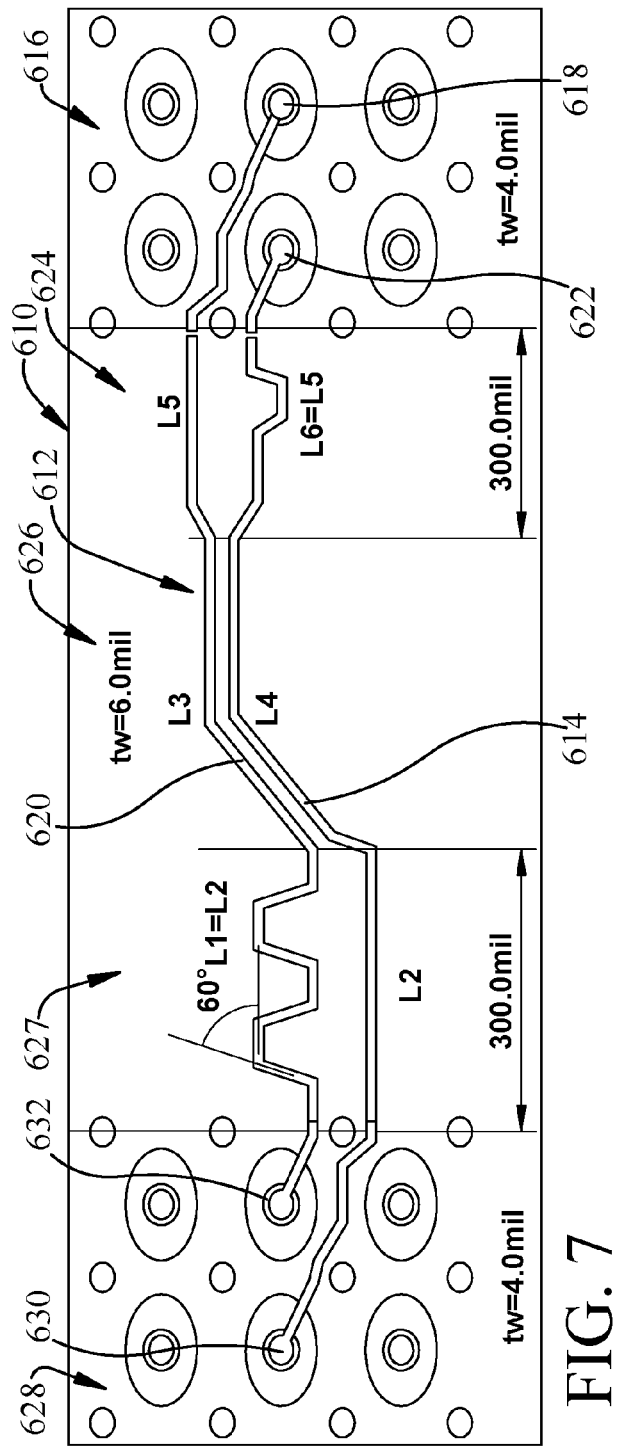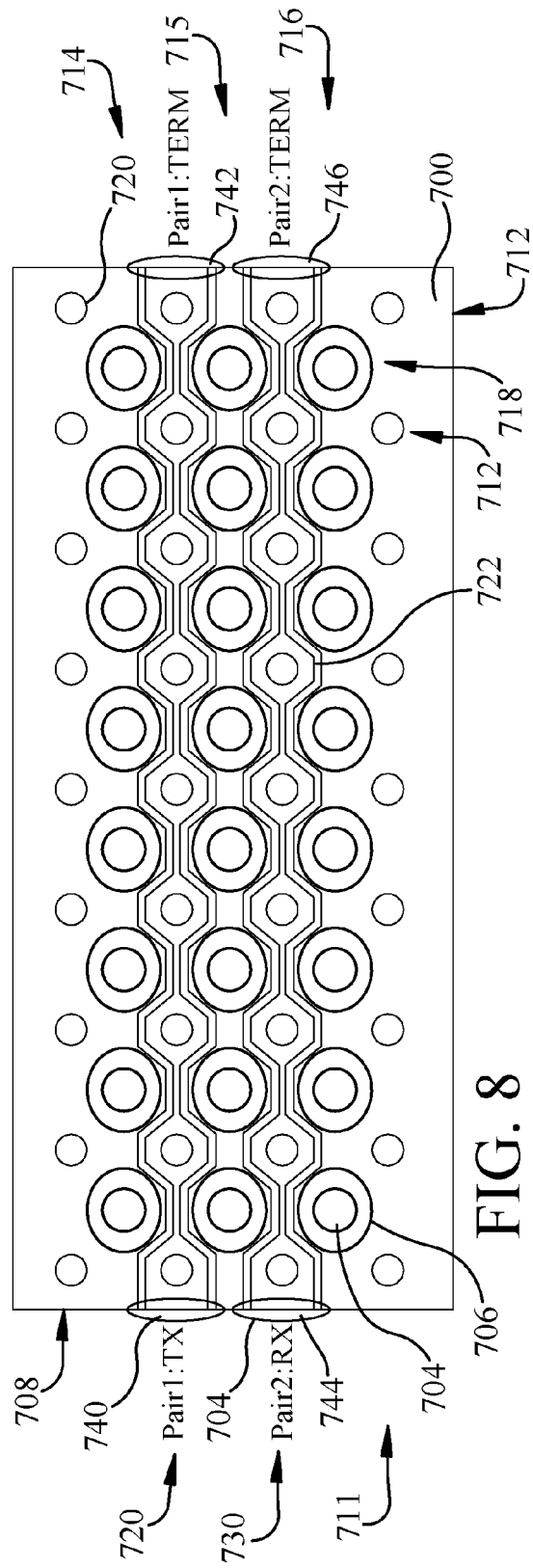

GROUND STRADDLING IN PTH PINFIELD FOR IMPROVED IMPEDANCE

CLAIM OF PRIORITY UNDER 35 U.S.C. §119

The present application for patent claims priority to Provisional Application No. 61/024,785 entitled "GROUND STRADDLING IN PTH PINFIELD FOR IMPROVED IMPEDANCE" filed 30 Jan. 2008, and assigned to the assignee hereof and hereby expressly incorporated by reference herein.

TECHNICAL FIELD

The subject disclosure relates generally to electrical connections between layers of multi-layer printed circuit boards and more particularly to a class of layer-to-layer interconnections referred to as via circuits or more simply vias.

BACKGROUND

High-speed communication links (e.g., ~5 Gb/s and higher per differential pair) typically include backplanes right angle connectors and or mother-board daughter-board configurations with stacking connectors. Plated through hole (PTH) connector pinfields of such right-angle and stacking connectors, whether press-fit or surface-mount, are one of the major causes of problems in printed circuit boards (PCB) that provide the routing for such connectors. In particular, the constrained routing of the pinfield geometry results in an undesirable situation wherein the impedance of signal vias is less than the 50 ohms single-ended (and less than 100 ohms differential), the impedance achieved by the rest of the communication channel, degrading performance.

In FIG. 1, one layer of a conventional multistack PCB 10 is depicted having a reference (ground) plane (e.g., copper plated on a substrate) 12 that is understood to overlay a substrate (note shown). The reference plane 12 overlies an orthogonal rectangular array of ground via pads 14 that surround respective ground via drill holes 18, forming a reference via 20; the ground via drill holes 18 may have inserted ground pins 16 in case of press-fit connectors or they may be hollow in case of surface mount connectors Another orthogonal rectangular array exists of signal via drill holes 24, each respectively centered among four adjacent grounding vias 18. Signal via drill holes may have inserted signal pins 22 in case of press-fit connectors or they may be hollow in case of surface mount connectors. Surrounding each signal via drill hole 24, a signal via pad 28, contacting conditionally the respective inserted signal pin 22, forms a signal via 30 for possible connection to a one of a plurality of traces 32. The metal of the reference plane 12 is removed for replacement by a circular anti-pad 34 of dielectric insulating material forming an annular ring surrounding each signal via 30.

The traces 32 are arranged as signal straddling differential pairs, for instance depicted as a first differential pair 36a composed of a lower trace 38a and an upper trace 40a and an adjacent second differential pair 36b composed of a lower trace 38b and upper trace 40b. Each pair 36a, 36b approaches a respective horizontal row of signal vias 30 from slightly below and slightly above centerline, respectively, and spreading apart to clear opposite sides of each anti-pad 34 for the respective row of anti-pads 34 until a particular signal via 30 is reached for each trace 38a, 38b, 40a, 40b, or until the differential pair clears through the pinfield.

The impedance of a typical signal via of a component pinfield in a typical multilayered PCB 10 with FR4 dielectric is always less than 50 ohms. The impedance depends largely on the diameter of the signal via drill hole 24, the diameter of the anti-pads 34, the dielectric constant of the insulating material, diameter and locations of the signal via pads 28, and spacing of the signal via drill holes 24 and ground via drill holes 18. It is desirable that the impedance be as close to 50 ohms as possible, which would be feasible if sufficient increase in diameter were available for the anti-pads 34. However, too large of a size would result in an also undesirable routing of traces overtop of the anti-pads 34 or reducing the separation between adjacent pairs 30a, 30b, resulting in increased cross talk between differential pairs 30a, 30b.

BRIEF DESCRIPTION OF THE DRAWINGS

FIG. 7 illustrates another PCB depicting a ground straddling differential pair with skew compensation.

FIG. 8 illustrates a PCB having a pair of adjacent ground straddling being tested for near end cross talk.

DESCRIPTION

Overview

Figure 1:
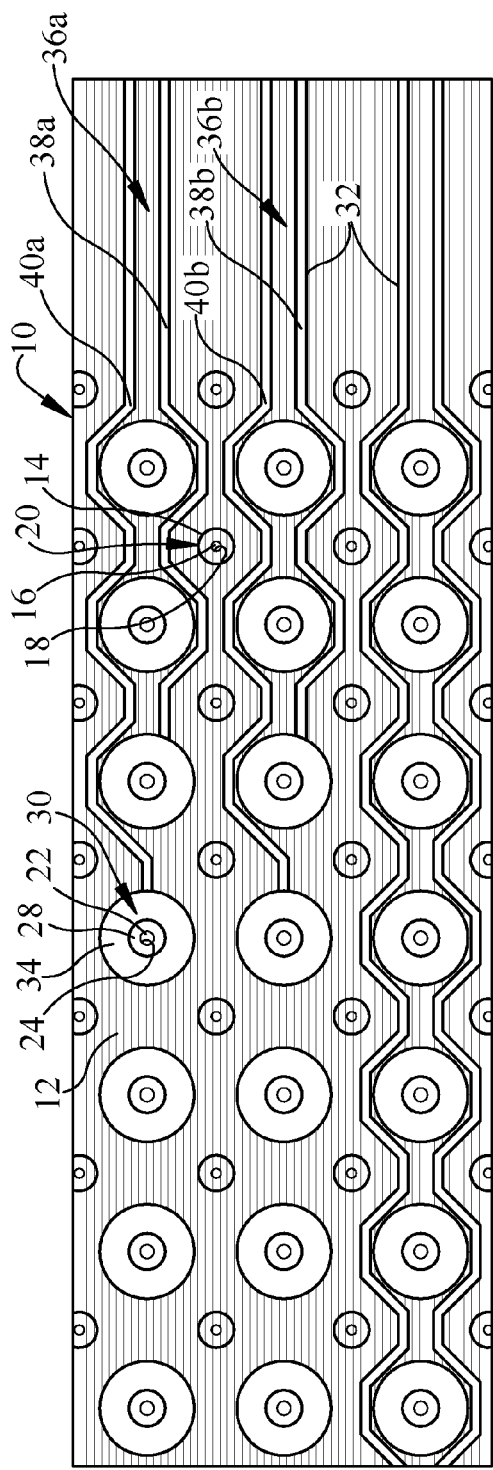
FIG. 1 illustrates a conventional printed circuit board (PCB) having signal straddling differential pairs of traces in a connector pinfield.

The following presents a simplified summary of the specification in order to provide a basic understanding of some aspects of the technology. This summary is not an extensive overview of the disclosure. It is not intended to identify key/critical elements of the disclosure or to delineate the scope of the technology. Its sole purpose is to present some concepts of the technology in a simplified form as a prelude to the more detailed description that is presented later.

The technology disclosed and claimed herein, in one aspect thereof, comprises a method of optimizing impedance of differential pairs of traces on a pinfield comprising of plated-through-holes (PTH) of a circuit board. A pinfield is provided of a rectangularly spaced array of signal vias and an interspersed rectangularly spaced array of reference vias. A differential pair of traces are aligned so that a first trace passes on one side of a centerline passing through a row of reference vias and a second trace passes on the other side of the centerline. The first and second traces can then be terminated at selected respective signal pins in a row of signal vias adjacent to the row of reference vias, or they may pass through the pinfield to another location on the PCB. Thereby, an enlarging of anti-pads around each signal via is possible without a resulting cross talk interference problem that occurs for signal straddling differential pairs.

To the accomplishment of the foregoing and related ends, certain illustrative aspects are described herein in connection with the following description and the annexed drawings. These aspects are indicative, however, of but a few of the various ways in which the principles of the technology can be employed and the subject specification is intended to include all such aspects and their equivalents. Other advantages and features of the technology will become apparent from the following detailed description when considered in conjunction with the drawings.

DESCRIPTION OF EXAMPLE EMBODIMENTS

High-speed communication links are improved by having differential pairs of traces in a connector pinfield on layers of a multilayer printed circuit board (PCB) positioned to straddle respective rows of reference (ground) vias rather than the respective rows of signal vias. Thus, a desirable increase in the size of each an anti-pad to surrounding each signal via pad can be incorporated without forcing tracing of adjacent differential pairs closer to one another, and thus increased cross talk is avoided. Thereby, a 50 ohm or close to 50 ohm impedance for each signal via is achieved. Spacing and routing between traces of each differential pair are advantageously adjusted for impedance optimization utilizing three dimensional computational electromagnetic tools.

The technology is now described with reference to the drawings, wherein like reference numerals are used to refer to like elements throughout. In the following description, for purposes of explanation, numerous specific details are set forth in order to provide a thorough understanding of the features and functionality. It may be evident, however, that the technology can be practiced without these specific details. In other instances, well-known structures and devices are shown in block diagram form in order to facilitate describing the features and functionality.

Figure 2:
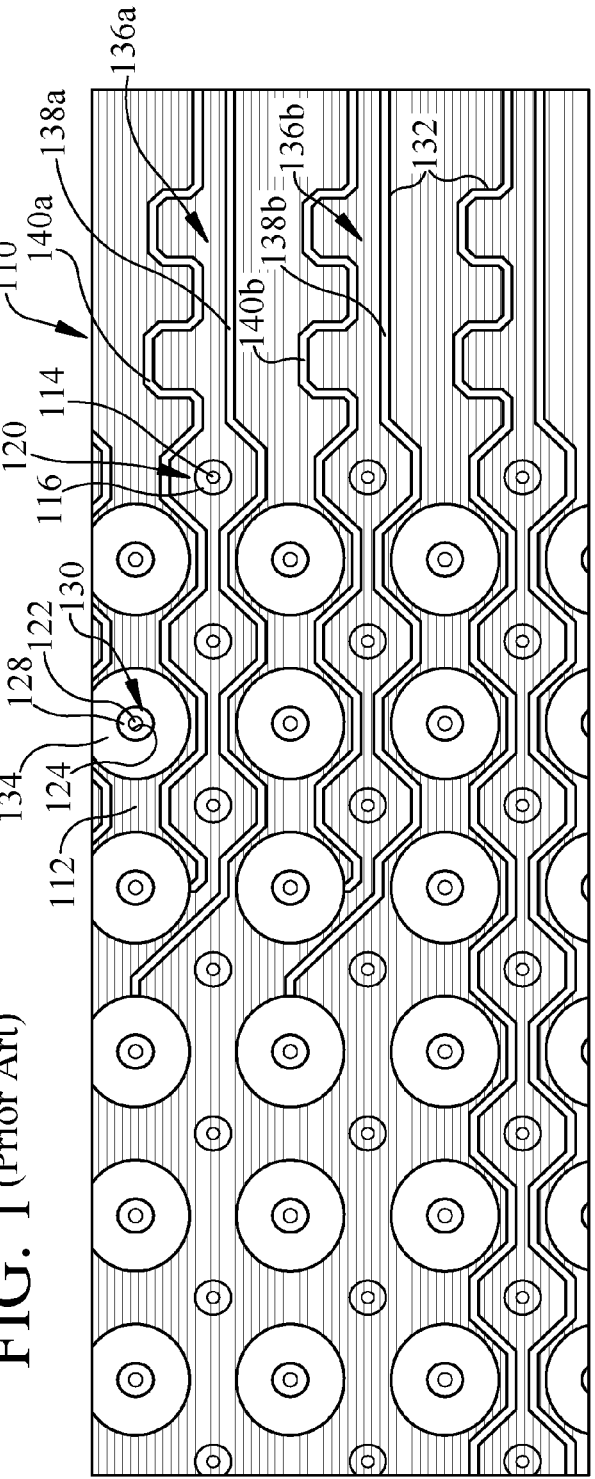
FIG. 2 illustrates a PCB having ground straddling differential pairs of traces in a connector pinfield with optimized spacing for consistent impedance and skew compensation.

In FIG. 2, one layer of a multistack PCB 110 is depicted having a reference (ground) plane (e.g., copper plated on a substrate) 112 that is understood to overlay a substrate (note shown). The reference plane 112 overlies an orthogonal rectangular array of ground via pads 114 that surround respective ground via drill holes 118, forming a reference via 120. Another orthogonal rectangular array of signal via drill holes 124 exists, each respectively centered among four adjacent grounding pins 116. Surrounding each signal via drill hole 124, a signal via pad 128, contacting the respective inserted signal pin 122 in case of a press-fit connector, forms a signal via 130 for possible connection to a one of a plurality of traces 132. The metal of the reference plane 112 is removed for replacement by an enlarged anti-pad 134 of dielectric insulating material forming an annular ring surrounding each signal via pad 128.

The traces 132 are arranged as ground straddling differential pairs (i.e., a "P" and an "N"), for instance depicted as a first differential pair 136a composed of a lower trace 138a and an upper trace 140a and an adjacent second differential pair 136b composed of a lower trace 138b and upper trace 140b. Each pair 136a, 136b approaches a respective horizontal row of reference vias 120 from slightly below and slightly above centerline, respectively, and spreading apart to avoid each ground via 120 to the extent allowed by also not routing over anti-pads 134 until a particular signal via 130 is reached for each trace 138a, 138b, 140a, 140b, or the pinfield is passed through.

This ground straddling approach allows for increasing the anti-pads 134, and thus increasing the impedance, by making each wider top to bottom as depicted and even more of an increase left to right as depicted. Yet, these increased do not force traces 132 of different differential pairs 136a, 136b closer (i.e., cross talk is not increased). Instead, the coupling is tighter for each differential pair 136a, 13b, respectively.

Figure 3:
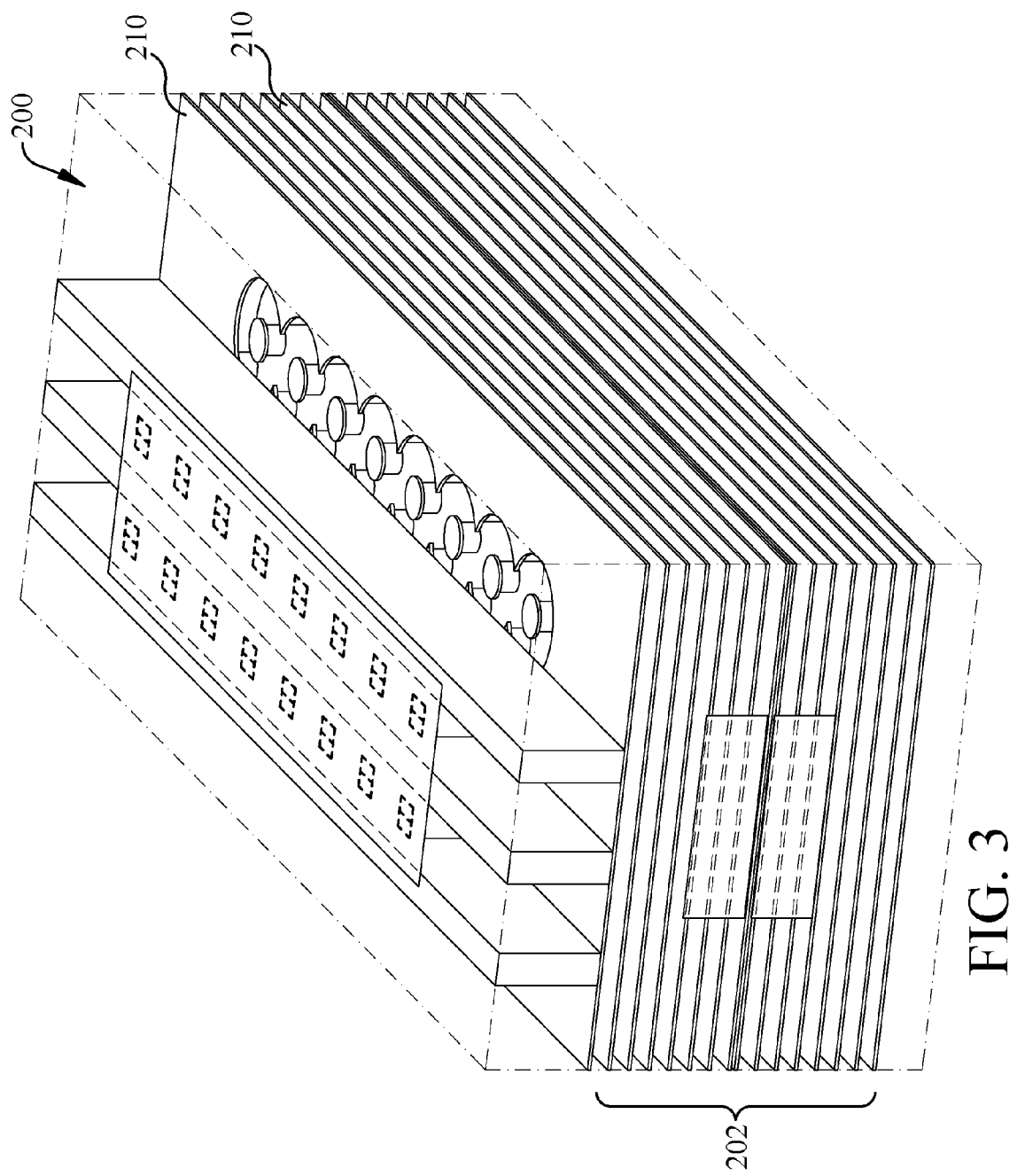
FIG. 3 illustrates a perspective view of a connector pinfield of FIG. 2 including part of the connector.

In FIG. 3, shown is a part of a connector and PCB 200 comprising of a stack 202 of multiple PCB layers 210 that advantageously utilize ground straddling differential pairs (not shown in FIG. 3).

Figure 4:
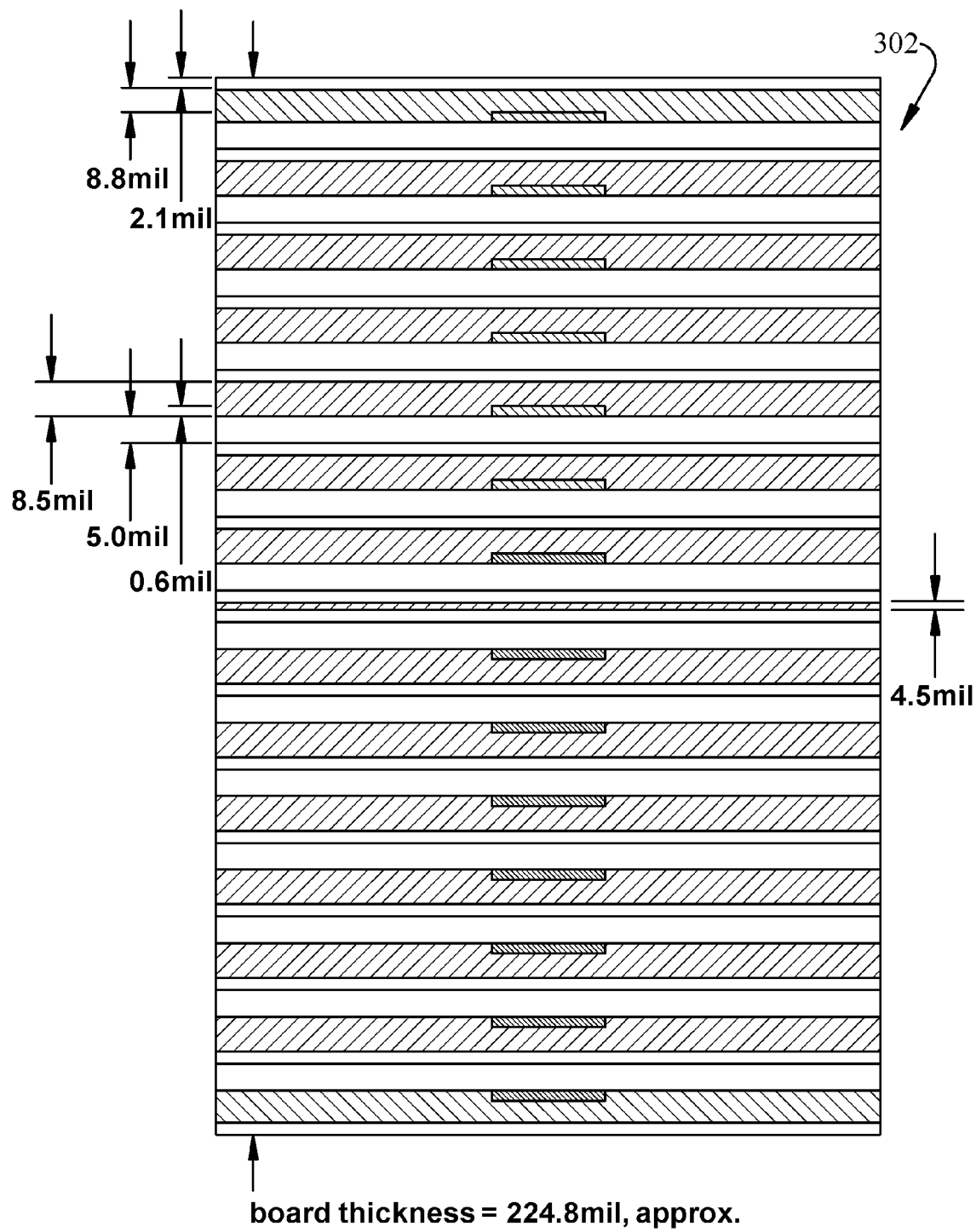
FIG. 4 illustrates the multilayer PCB of the high-speed communication link of FIG. 3 in vertical cross section.

In FIG. 4, an illustrative stack cross-section 302 for the PCB 200 is depicted.

Figure 5:
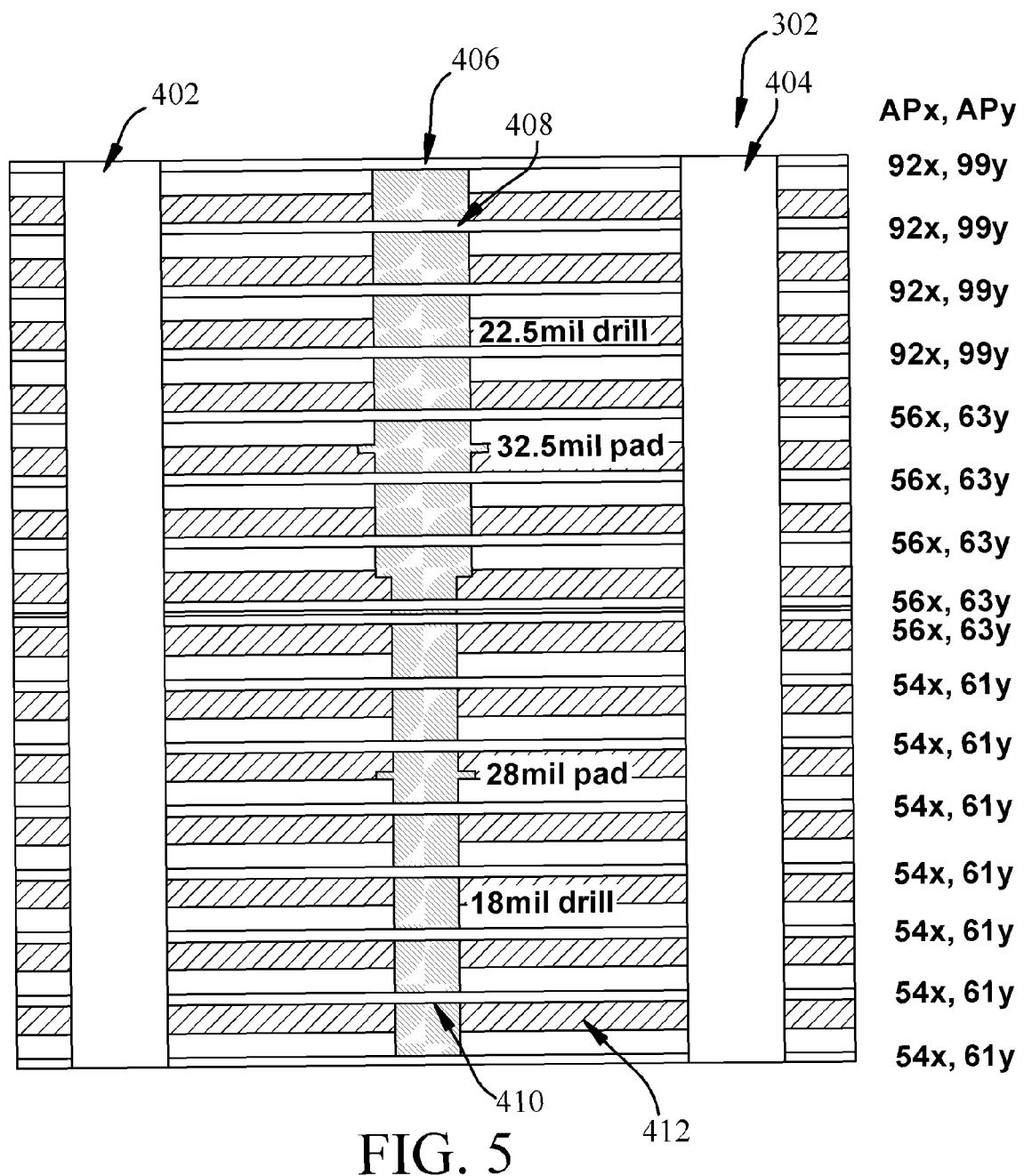
FIG. 5 illustrates the multilayer PCB of the high-speed communication link of FIG. 3 in vertical cross section taken diagonally centered through a signal pin and two adjacent reference (ground) pins.

In FIG. 5, the illustrative stack 302 is depicted in section to expose two reference pins 402, 404, and a signal pin 406. Although a signal pin 406 having a larger diameter upper portion 408 and a smaller diameter lower portion 410 is depicted, it should be appreciated that a constant diameter signal pin can also benefit from having PCB layers 412 that utilize ground straddling differential pairs.

Figure 6:
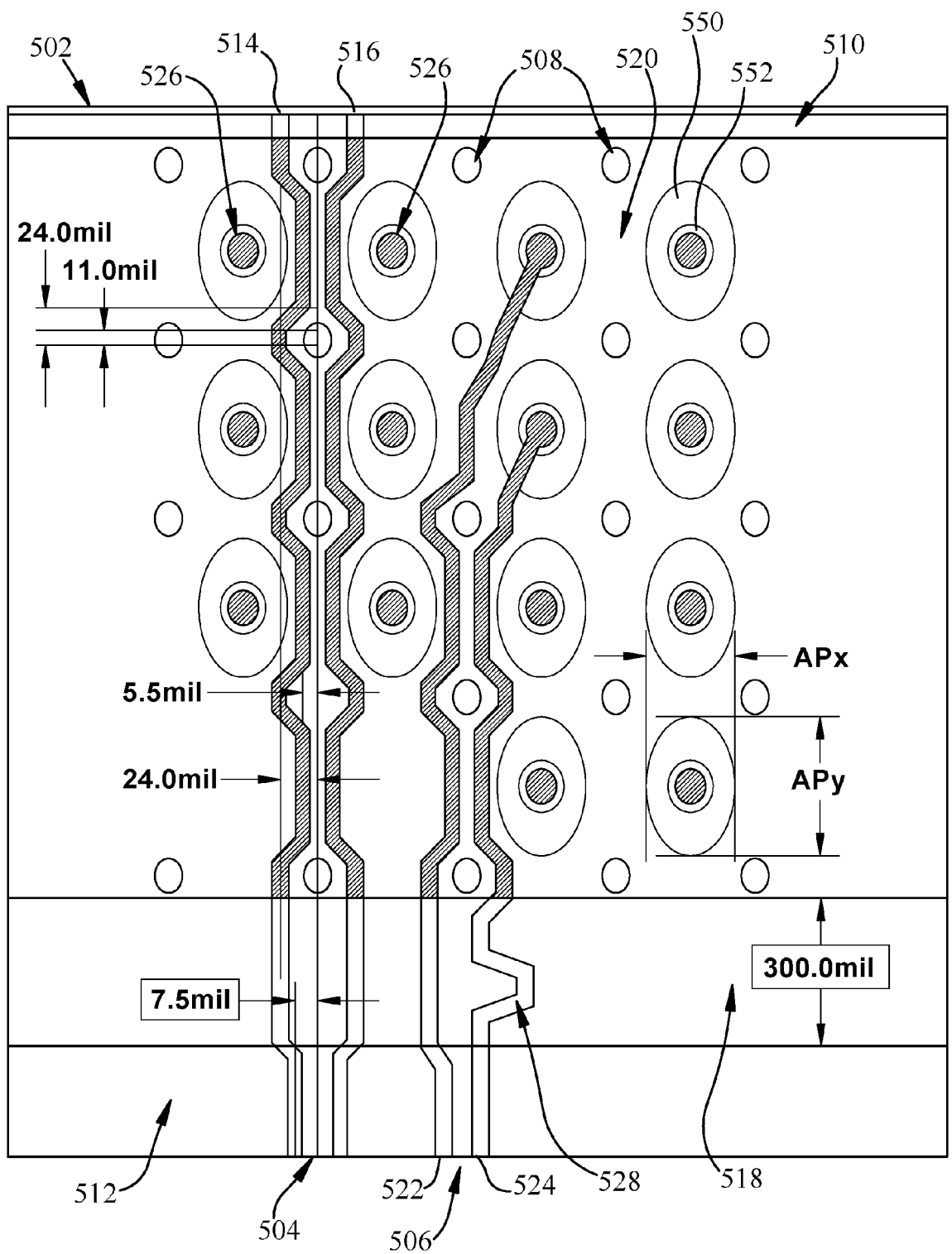
FIG. 6 illustrates another PCB having enlarged anti-pads and ground straddling differential pair of traces with skew compensation and impedance optimization.

In FIG. 6, a PTH PCB 502 has first and second differential pairs 504, 506 that ground straddle a vertical column of reference pins 508 to exit at an upper band portion 510 depicted transitioning for termination on another PCB structure (not shown). A lowest band portion 512 where the pair 504 enters shows that a left trace 514 and right trace 516 are spaced about 7.5 mils from a centerline that widens to about 24.0 mils from a centerline in a skew compensation band 518 that lies between the lowest band portion 512 and a pinfield portion 520 of the PCB 502. The traces 514, 516 narrow their spacing to about 5.5 mil from the centerline between each reference pin 508. The flaring away from each reference pin 508 to about 24.0 miles from centerline begins and ends respectively about 11.0 mils (i.e., below and above as depicted) a center point of a given reference pin 508. It should be appreciated that the exact spacing is selected utilizing a three-dimensional computational electromagnetic tool (e.g., MICROWAVE STUDIO™ software available from COMPUTER SIMULATION TECHNOLOGY™ and HFSS™ available from ANSOFT CORPORATION™).

The second differential pair 506 has a left and right trace 522, 524 that are similarly routed with regards to their respective vertical column of reference pins 508 except that the left trace 522 transitions to the right and upwardly after going to the left of a third reference pin 508 and terminates at a top (fourth) signal pin 526 while the right trace 524 transitions to the right and up to terminate at a third signal pin 526. Since the left trace 522 is thus longer than the right trace 524, skew compensation is provided so that a differential signal will reach each termination simultaneously. In particular, the right trace 524 has an undulating portion 528 in the 300.0 mil high skew compensation band 518.

Each anti-pad 550 depicted as surrounding a signal via pad 552 of a signal via hole 526 advantageously includes a widened diameter $AP_x$ (i.e., the side toward a row of reference pins 508) and an even more elongated diameter $AP_y$ directed toward the next signal pin 526 in the vertical column as depicted.

In FIG. 7, a PTH PCB 610 is depicted wherein a differential pair 612 has a lower trace 614 whose right-hand termination is in a right pinfield 616 at a right-most via 618 while an upper trace 620 has a right-hand termination at an adjacent signal via 622, just to the left of the right-most via 618. The differential pair 612 passes through 300.0 mil right skew compensation band 624, through a center band 626, through a 300.0 mil left skew compensation band 627 to terminate in a left pinfield 628. In particular, the lower trace 614 terminates in a left-most signal via 630 and the upper trace terminates in an adjacent signal via 632 to the right of the left-most signal via 630. The right-hand terminations come in from above the respective signal vias 618, 622 and the left-hand terminations come in from below the signal vias 630, 632. Thus, the differential pair 612 trends downward from right to left in the center band 626, maintaining a close proximity for good differential noise cancellation. To compensate for the longer length of the upper trace 620 within the right pinfield 616, the lower trace 616 includes an undulating portion 634 in the right skew compensation band 624. To compensate for the longer length of the lower trace 616 in the left pinfield 628, the upper trace 620 includes an undulating portion 636 in the left skew compensation band 626.

In FIG. 8, a PCB 700 includes ground vias 702 and signal vias 704, the latter within a respective anti-pad 706. The ground vias 702 are arranged in a rectangular array composed of a first (top) through fourth (bottom) rows 708-711 of nine ground vias 702 each, also vertically aligned to form nine columns 712. The signal vias 704 are arranged in a rectangular array composed of a first (top) through third (bottom) rows 714-716, also vertically aligned to form eight columns 718. Each signal via 704 lies equidistantly from four adjacent ground vias 702 about each corner. A first pair 720 of traces 722 straddles the second row 709 of ground vias 702 as constrained by the anti-pads 706s of the first and second rows 714, 715 of signal vias 704. A second pair 730 of traces 722 straddles the third row 710 of ground vias 702 as constrained by the anti-pads 706s of the second and third rows 715, 716 of signal vias 704. In testing near end cross-talk, a differential transmitter (TX) excites a near (left) ends 740 of the first pair 720 of traces 722 with first pair far (right) end terminations 742. A near end cross-signal receiver (RX) is connected to near (left) ends 744 of the second pair 730 of traces 722 with far (right) end terminations 746. In FIG. 8, the circuitry described for FIG. 7 is the same except that for far end cross-talk receiver (RX) being connected to the far (right) ends 754 of the second pair 730 of traces 722 with near (left) end terminations 756.

Figure 9:
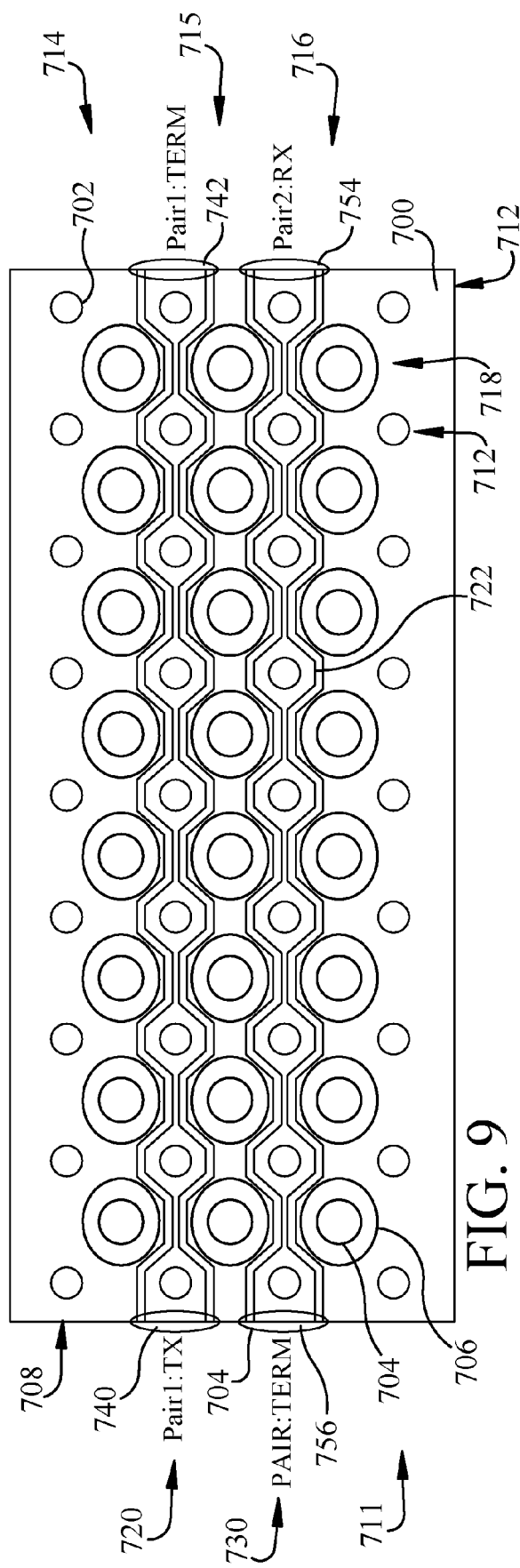
FIG. 9 illustrates a PCB having a pair of adjacent ground straddling being tested for far end cross talk.
Figure 10:
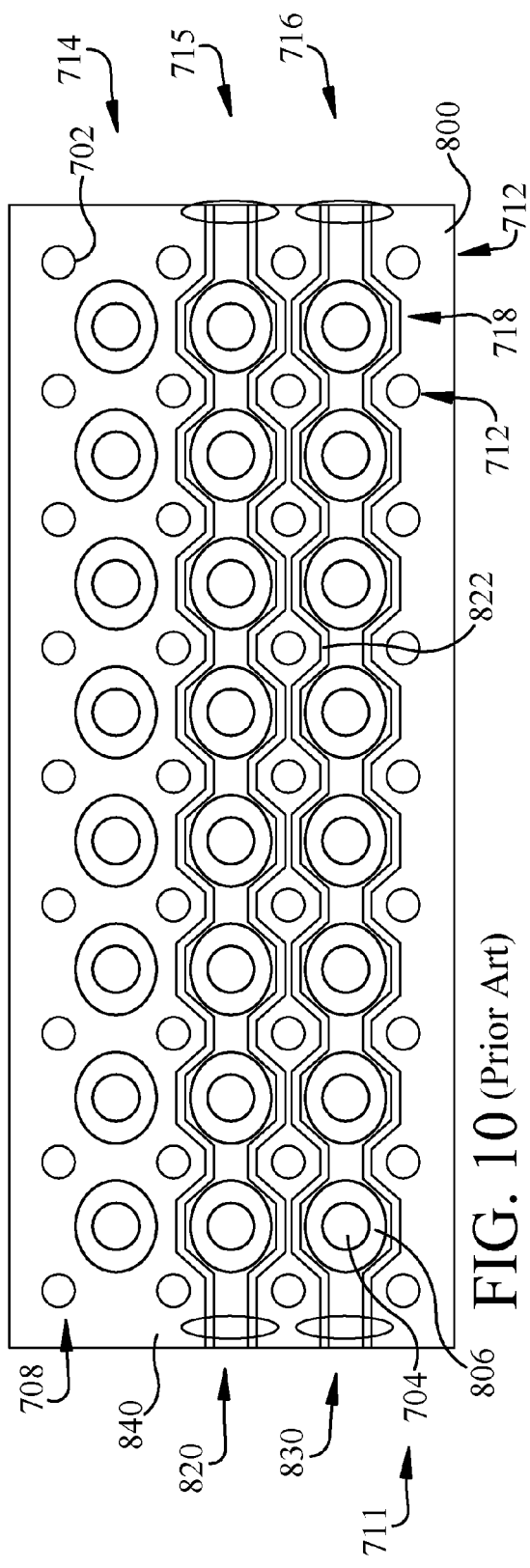
FIG. 10 illustrates a conventional PCB having signal straddling pairs of traces with the same array of ground and signal vias of FIG. 8.

For comparison purposes, in FIG. 10 a convention (i.e., signal straddling) PCB includes the same arrangement of ground vias 702 and signal vias 704 described above for FIG. 8. Anti-pads 806 are required to be disadvantageously smaller, though to allow for a first pair 820 of traces 822 to straddle the second row 715 of signal vias 704. A second pair 830 of traces 822 straddles the third row 716 of signal vias 704. Transmission, reception, and termination correspond to FIGS. 8-9 for near and far cross-talk testing, respectively.

Figure 11:
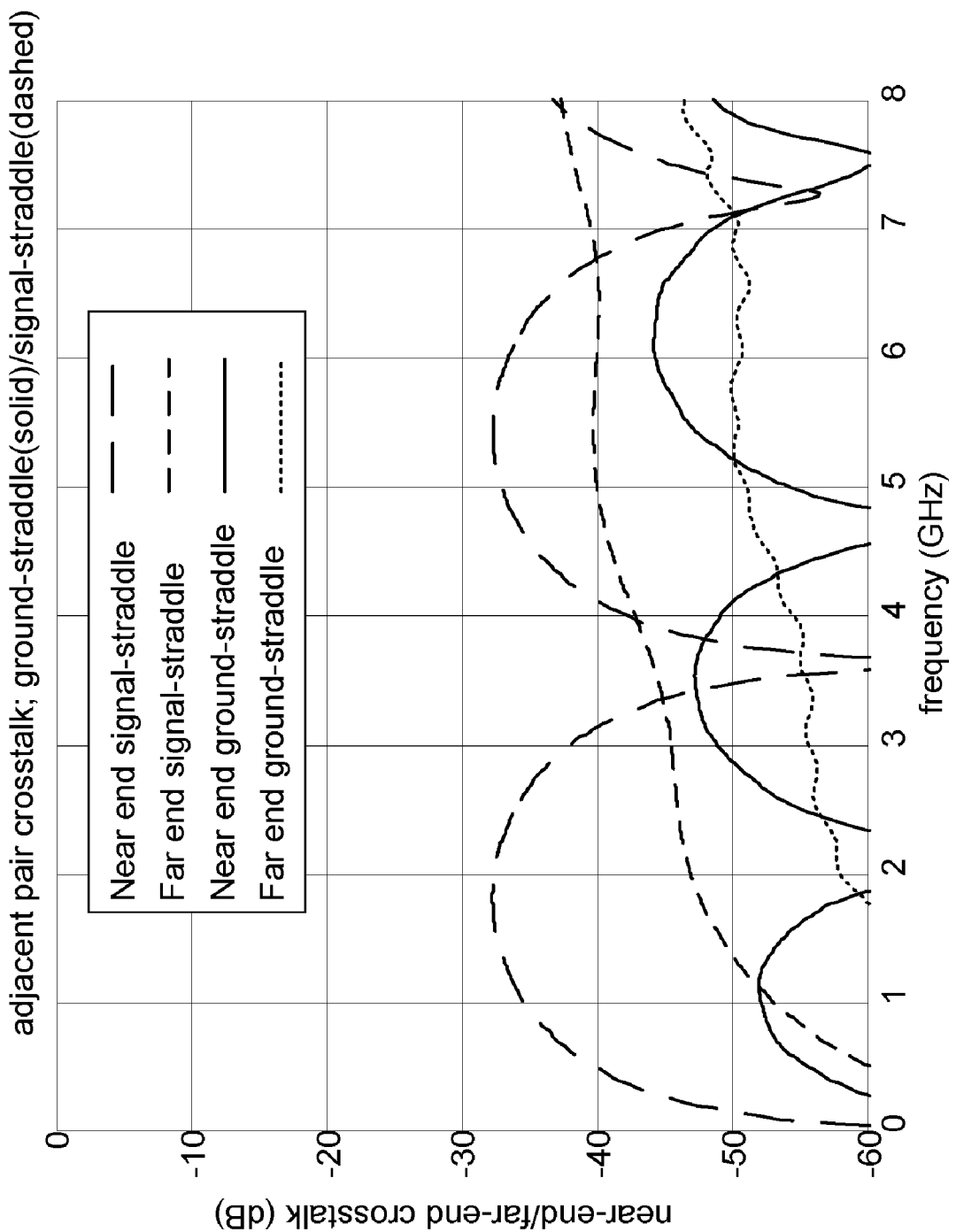
FIG. 11 illustrates a plot for simulated results for near end and far end cross talk for the PCBs of FIGS. 8-9 compared to the conventional PCB of FIG. 10.

Simulated performance analyses indicate that return loss profiles of vias connecting on ten different layers in a multi-layer stack simulated to have the consistent close to 50 ohm impedance for signal vias over a range frequency to 20 GHz, showing a nominal performance of being below −15 dB up to 10 GHz exceeds convention (i.e., signal straddling) results by at least 5 dB. In FIG. 11, an example of such results is depicted comparing the performance of a ground-straddling arrangement of FIGS. 8-9 to the conventional signal-straddling arrangement of FIG. 10.

Figure 12:
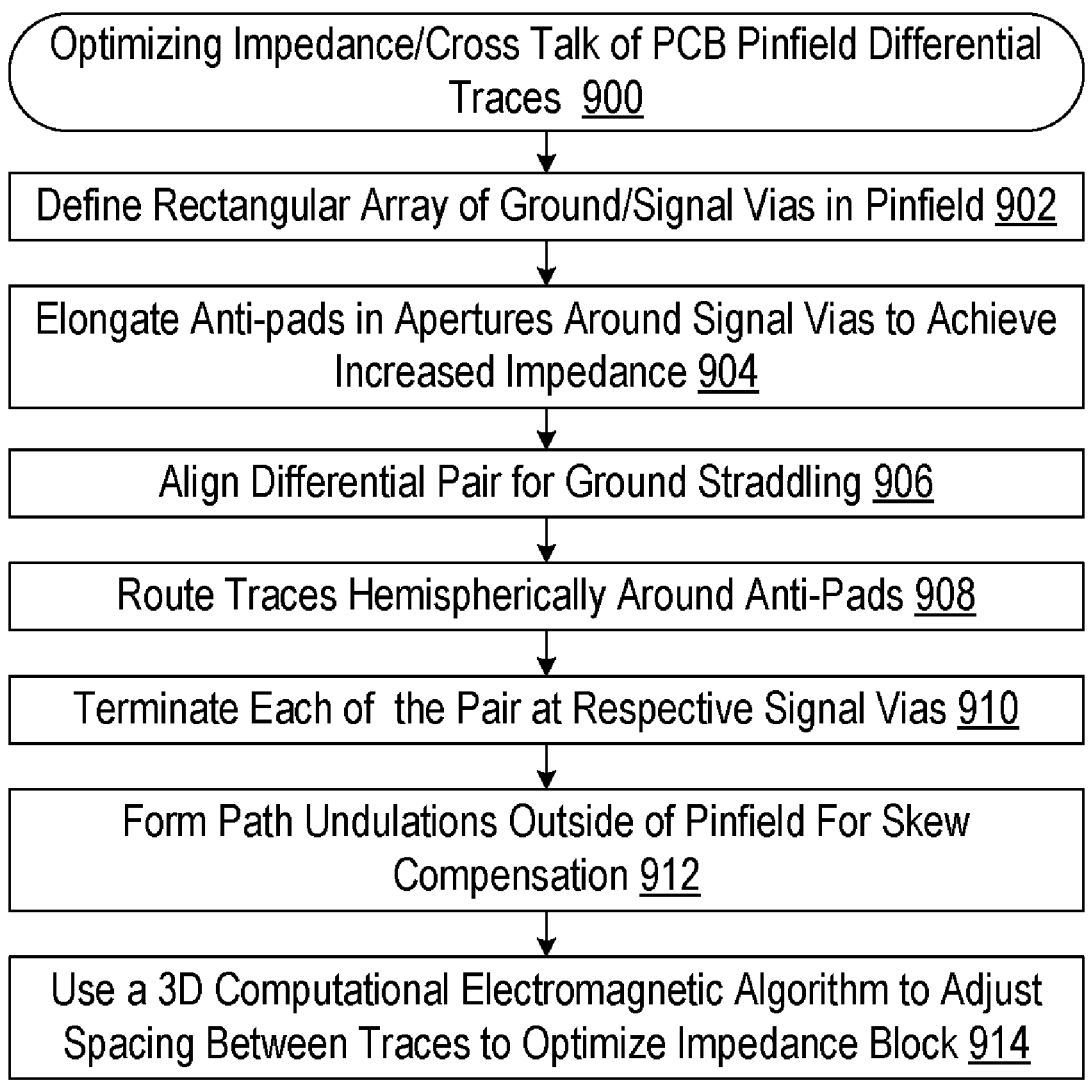
FIG. 12 illustrates a flow diagram of a methodology for optimizing impedance of a PCB utilizing ground straddling differential traces.

In FIG. 12, a methodology 900 is depicted for optimizing impedance and reducing cross talk of differential pairs of traces on a plated through holes pinfield of a circuit board. In block 902, definition is generated for a pinfield of a rectangularly spaced array of signal vias and an interspersed rectangularly spaced array of reference vias. In block 904, enlargement is made along a row centerline of an aperture in a conductive ground plane surrounding each signal plane and widening the aperture to a diameter that achieves a desired via impedance. It should be appreciated with the benefit of the present disclosure that such enlargement prevents a signal straddling layout of a differential pair of traces.

In block 906, general alignment of a differential pair of traces is made such that a first trace passes on one side of a centerline passing through a row of reference vias and a second trace passes on the other side of the centerline, creating a ground-straddling arrangement. In block 908, the traces are routed trace hemispherically around each reference via to a diameter permitted without routing over an anti-pad in an aperture surrounding each respective signal via. In block 910, terminations are determined for the first and second traces at selected respective signal vias in a row of signal vias adjacent to the row of reference vias. In block 912, path undulations are added to a selected trace of the differential pair in a region of the circuit board outside of the pinfield for skew compensation, based upon the path length to these terminations. In block 914, spacing the traces of the differential pair in the pinfield in accordance with a three dimension computational electromagnetic algorithm to optimize an overall impedance for the differential pair. In some applications, such optimization can be directed to applications in which a 50 ohm impedance single-ended and approximately a 100 ohm impedance differentially is desired.

Figure 13:
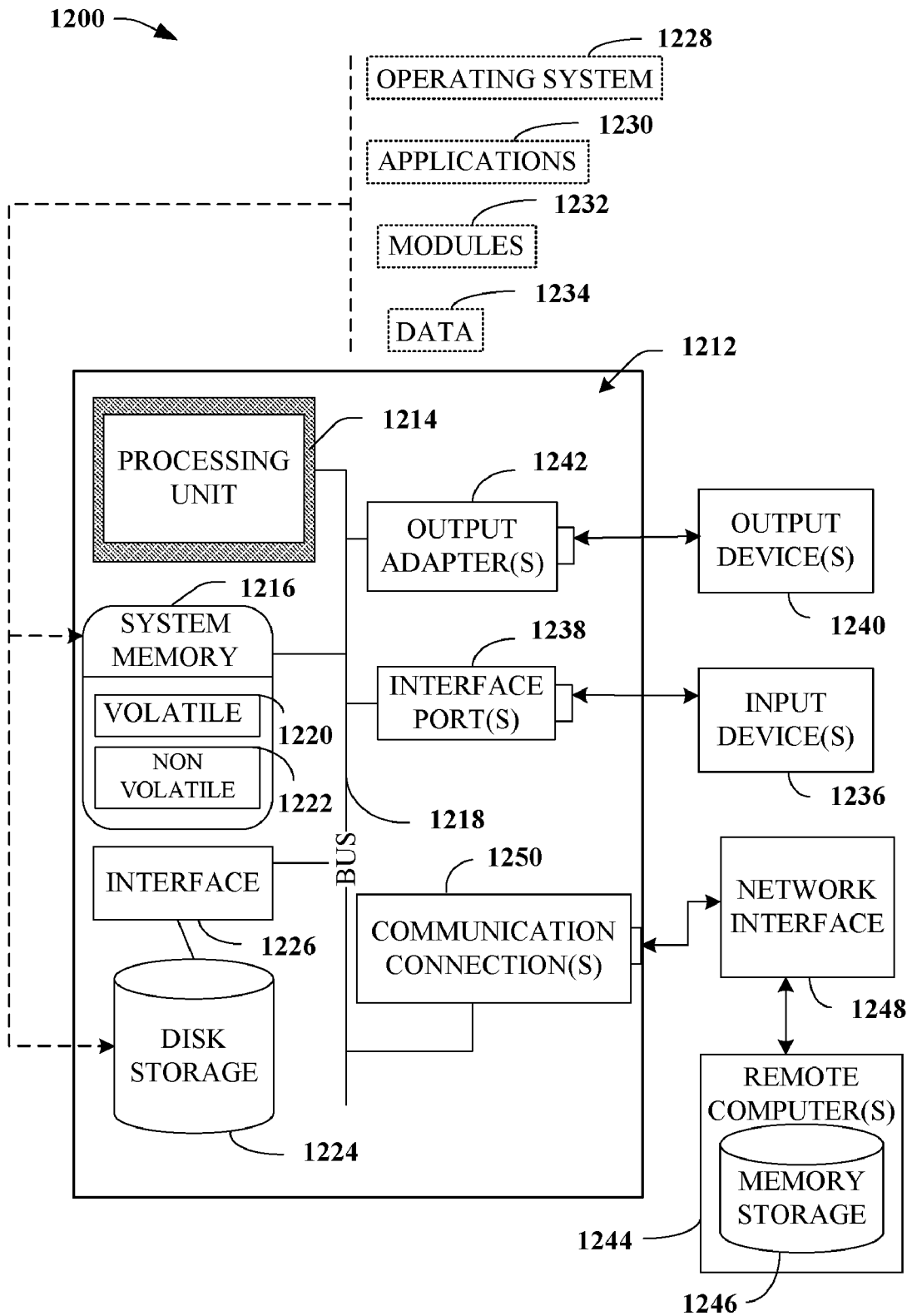
FIG. 13 illustrates an exemplary operating environment that can be employed in accordance with the claimed subject matter.

In order to provide additional context for implementing various aspects of the claimed subject matter, FIG. 13 and the following discussion is intended to provide a brief, general description of a suitable computing environment in which the various aspects of the subject innovation may be implemented. For example, performing the three dimension computational electromagnetic algorithm to optimize an overall impedance for the differential pair, as described in the previous figures, can be implemented in such suitable computing environment. While the claimed subject matter has been described above in the general context of computer-executable instructions of a computer program that runs on a local computer and/or remote computer, those skilled in the art will recognize that the subject innovation also may be implemented in combination with other program modules. Generally, program modules include routines, programs, components, data structures, etc., that perform particular tasks and/or implement particular abstract data types.

Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based and/or programmable consumer electronics, and the like, each of which may operatively communicate with one or more associated devices. The illustrated aspects of the claimed subject matter may also be practiced in distributed computing environments where certain tasks are performed by remote processing devices that are linked through a communications network. However, some, if not all, aspects of the subject innovation may be practiced on stand-alone computers. In a distributed computing environment, program modules may be located in local and/or remote memory storage devices.

With reference to FIG. 13, an exemplary environment 1200 for implementing various aspects of the claimed subject matter includes a computer 1212. The computer 1212 includes a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include read only memory (ROM), programmable ROM (PROM), electrically programmable ROM (EPROM), electrically erasable programmable ROM (EEPROM), or flash memory. Volatile memory 1220 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1212 also includes removable/non-removable, volatile/non-volatile computer storage media. FIG. 13 illustrates, for example a disk storage 1224. Disk storage 1224 includes, but is not limited to, devices like a magnetic disk drive, floppy disk drive, tape drive, Jaz drive, Zip drive, LS-100 drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to the system bus 1218, a removable or non-removable interface is typically used such as interface 1226.

It is to be appreciated that FIG. 13 describes software that acts as an intermediary between users and the basic computer resources described in the suitable operating environment 1200. Such software includes an operating system 1228. Operating system 1228, which can be stored on disk storage 1224, acts to control and allocate resources of the computer system 1212. System applications 1230 take advantage of the management of resources by operating system 1228 through program modules 1232 and program data 1234 stored either in system memory 1216 or on disk storage 1224. It is to be appreciated that the claimed subject matter can be implemented with various operating systems or combinations of operating systems.

A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port may be used to provide input to computer 1212, and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refers to the hardware/software employed to connect the network interface 1248 to the bus 1218. While communication connection 1250 is shown for illustrative clarity inside computer 1212, it can also be external to computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

What has been described above includes examples of the subject innovation. It is, of course, not possible to describe every conceivable combination of components or methodologies for purposes of describing the claimed subject matter, but one of ordinary skill in the art may recognize that many further combinations and permutations of the subject innovation are possible. Accordingly, the claimed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable medium having computer-executable instructions for performing the acts and/or events of the various methods of the claimed subject matter.

There are multiple ways of implementing the present innovation, e.g., an appropriate API, tool kit, driver code, operating system, control, standalone or downloadable software object, etc. which enables applications and services to use the advertising techniques of the invention. The claimed subject matter contemplates the use from the standpoint of an API (or other software object), as well as from a software or hardware object that operates according to the advertising techniques in accordance with the invention. Thus, various implementations of the innovation described herein may have aspects that are wholly in hardware, partly in hardware and partly in software, as well as in software.

What has been described above includes examples of the technology. It is, of course, not possible to describe every conceivable combination of components or methodologies for purposes of describing the subject disclosure, but one of ordinary skill in the art may recognize that many further combinations and permutations of the specification are possible. Accordingly, the technology is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A printed circuit board for a communication connector, comprising:
   a pinfield of a rectangularly spaced array of signal vias and an interspersed rectangularly spaced array of reference vias, arranged such that each signal via, which is not at an edge of the array of signal vias, is centered among four adjacent reference vias;
   a differential pair of traces aligned so that a first trace passes on one side of a centerline passing through a row of reference vias and a second trace passes on the other side of the centerline; and
   first and second terminations respectively of the first and second traces at selected respective signal vias in a row of signal vias adjacent to the row of reference vias.

2. The printed circuit board of claim 1, further comprising:
   a substrate;
   a ground plane affixed to the substrate;
   an aperture formed in the ground plane surrounding each signal via; and
   an anti-pad composed of a dielectric insulating material sized for the aperture,
   wherein the aperture and anti-pad are sized to approach a 50 ohm single ended impedance by a respective trace.

3. The printed circuit board of claim 1, further comprising each trace routed hemispherically around each reference via to a diameter permitted without routing over an anti-pad in an aperture surrounding each respective signal via.

4. The printed circuit board of claim 1, further comprising the first trace having a longer path length in the pinfield than the second trace that comprises an added path undulations in a region of the circuit board outside of the pinfield for skew compensation.

5. The printed circuit board of claim 1, further comprising the differential pair of traces spaced in the pinfield in accordance with a three dimension computational electromagnetic algorithm to optimize an overall impedance for the differential pair.

6. The printed circuit board of claim 5, further comprising the differential pair of traces spaced in a ground straddling alignment to approximately a 50 ohm impedance single-ended and approximately a 100 ohm impedance differentially.

7. An apparatus having optimizing impedance of differential pairs of traces on a plated through holes pinfield of a circuit board, comprising:
   on a pinfield of a rectangularly spaced array of signal vias and an interspersed rectangularly spaced array of reference vias, such that each signal via, which is not at an edge of the array of signal vias, is centered among four adjacent reference vias, means for aligning a differential pair of traces so that a first trace passes on one side of a centerline passing through a row of reference vias and a second trace passes on the other side of the centerline; and
   means for terminating the first and second traces at selected respective signal vias in a row of signal vias adjacent to the row of reference vias.

8. The apparatus of claim 7, further comprising means for enlarging along a row centerline an aperture in a conductive ground plane surrounding each signal via and widening the aperture to a diameter that prevents a signal straddling layout of a differential pair of traces, thereby increasing signal via impedance.

9. The apparatus of claim 7, further comprising means for routing each trace hemispherically around each reference via to a diameter permitted without routing over an anti-pad in an aperture surrounding each respective signal via.

10. The apparatus of claim 7, further comprising means for adding path undulations to a selected trace of the differential pair in a region of the circuit board outside of the pinfield for skew compensation.

11. The apparatus of claim 7, further comprising means for spacing the traces of the differential pair in the pinfield in accordance with a three dimension computational electromagnetic algorithm to optimize an overall impedance for the differential pair.

12. The apparatus of claim 11, further comprising means for spacing the traces of the differential pair in a ground straddling alignment to approximately a 50 ohm impedance single-ended and approximately a 100 ohm impedance differentially.

13. A method of optimizing impedance of differential pairs of traces on a plated through holes pinfield of a circuit board, comprising:
   on a pinfield of a rectangularly spaced array of signal vias and an interspersed rectangularly spaced array of reference vias, such that each signal via, which is not at an edge of the array of signal vias, is centered among four adjacent reference vias, aligning a differential pair of traces so that a first trace passes on one side of a centerline passing through a row of reference vias and a second trace passes on the other side of the centerline; and terminating the first and second traces at selected respective signal vias in a row of signal vias adjacent to the row of reference vias.

14. The method of claim 13, further comprising enlarging along a row centerline an aperture in a conductive ground plane surrounding each signal via and widening the aperture to a diameter that prevents a signal straddling layout of a differential pair of traces, thereby increasing signal via impedance.

15. The method of claim 13, further comprising routing each trace hemispherically around each reference via to a diameter permitted without routing over an anti-pad in an aperture surrounding each respective signal via.

16. The method of claim 13, further comprising adding path undulations to a selected trace of the differential pair in a region of the circuit board outside of the pinfield for skew compensation.

17. The method of claim 13, further comprising spacing the traces of the differential pair in the pinfield in accordance with a three dimension computational electromagnetic algorithm to optimize an overall impedance for the differential pair.

18. The method of claim 17, further comprising spacing the traces of the differential pair in a ground straddling alignment to approximately a 50 ohm impedance single-ended and approximately a 100 ohm impedance differentially.

* * * * *